United States Patent
Rubin

(10) Patent No.: US 7,629,830 B1
(45) Date of Patent: Dec. 8, 2009

(54) VOLTAGE LEVEL SHIFTER

(75) Inventor: Adam Rubin, Tel-Aviv (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/182,478

(22) Filed: Jul. 30, 2008

(51) Int. Cl.
*H03L 5/00* (2006.01)
(52) U.S. Cl. .............................. 327/333; 326/81; 326/63
(58) Field of Classification Search ............. 326/62–63, 326/80–81; 327/306, 333, 24
See application file for complete search history.

(56) References Cited

U.S. PATENT DOCUMENTS

| | | | | |
|---|---|---|---|---|
| 6,130,563 A | * | 10/2000 | Pilling et al. | 327/111 |
| 6,828,825 B2 | * | 12/2004 | Johnson et al. | 326/68 |
| 7,227,400 B1 | * | 6/2007 | Gillespie et al. | 327/333 |

* cited by examiner

*Primary Examiner*—Dinh T. Le
(74) *Attorney, Agent, or Firm*—Seth Z. Kalson

(57) ABSTRACT

A voltage level shifter circuit, comprising diodes to provide a voltage buffer to reduce output voltage swings, and edge detection circuits to momentarily turn on pull-up pMOSFETs so as to speed up the voltage level shifting at input signal transitions and to mitigate static power dissipation. Other embodiments are described and claimed.

15 Claims, 4 Drawing Sheets

VOLTAGE LEVEL SHIFTER

FIELD

The present invention relates to an electronic circuit, and more particularly to a voltage level shifter circuit.

BACKGROUND

FIG. 1 illustrates a prior art voltage level shifter circuit. A differential input signal is applied to input ports 102 and 104, and the output signal is taken at output ports 106 and 108. The level shifter circuit is designed to shift input voltage levels $V_{SSL}$ and $V_{CCL}$ to output voltage levels $V_{SSH}$ and $V_{CCH}$. The voltage levels $V_{SSL}$ and $V_{CCL}$ are the LOW and HIGH voltages, respectively, in a first voltage domain; and the voltage levels $V_{SSH}$ and $V_{CCH}$ are the LOW and HIGH voltages, respectively, in a second voltage domain, where $V_{SSL} < V_{SSH}$ and $V_{CCL} < V_{CCH}$. The voltage $V_{CCL}$ is provided by diode-connected pMOSFETs 110 and 112, with their drains connected to their respective gates, to provide a voltage drop (buffer) of $V_T$, where $V_T$ denotes their threshold voltage. For the circuit of FIG. 1, $V_T + V_{SSL} = V_{SSH}$. Cross-coupled transistors 114 and 116 provide a differential latch amplifier function so that either output port 106 or 108 is brought to $V_{CCH}$, depending upon the input signals at input ports 102 and 104.

In many instances, pMOSFETs 110 and 112 may have a relatively high leakage current, so that to maintain the voltage buffer $V_T$ provided by these diode-connected transistors, pMOSFETs 130 and 132 are introduced to provide leakage current to the sources of diode-connected pMOSFETs 110 and 112. However, this intentionally introduced leakage current contributes to static power consumption. Reducing the leakage current by decreasing the size of diode-connected transistors 110 and 112 may aggravate the dynamic behavior of the circuit. Furthermore, the voltage buffer provided by transistors 110 and 112, as well as their leakage currents, may change across process corners. Note also that when in a static mode, there is a direct current path from power supply rail ($V_{CCH}$) 134 to one of power supply rails 136 ($V_{CCL}$), thereby also contributing to static power consumption.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1:
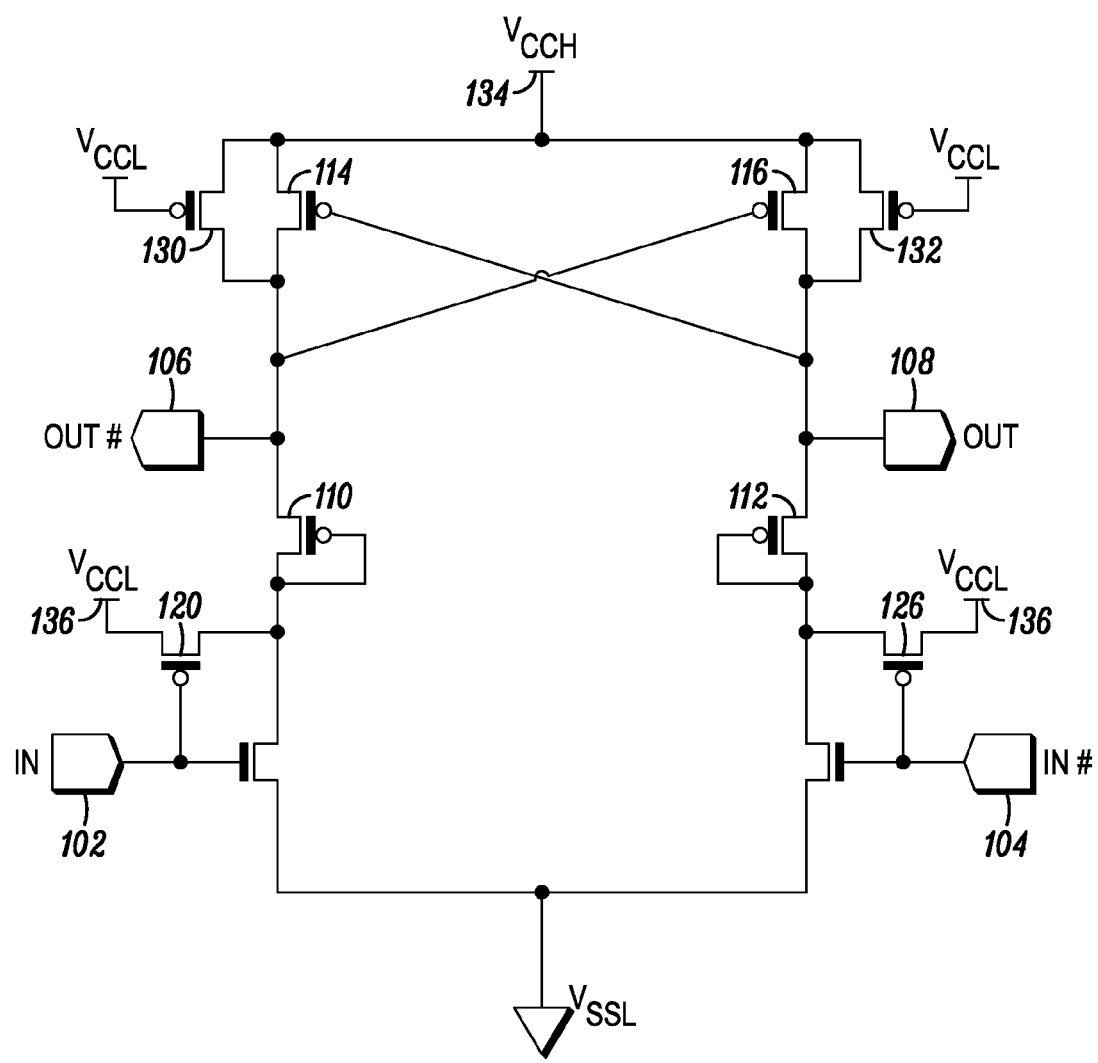
FIG. 1 illustrates a prior art voltage level shifter circuit.
Figure 2:
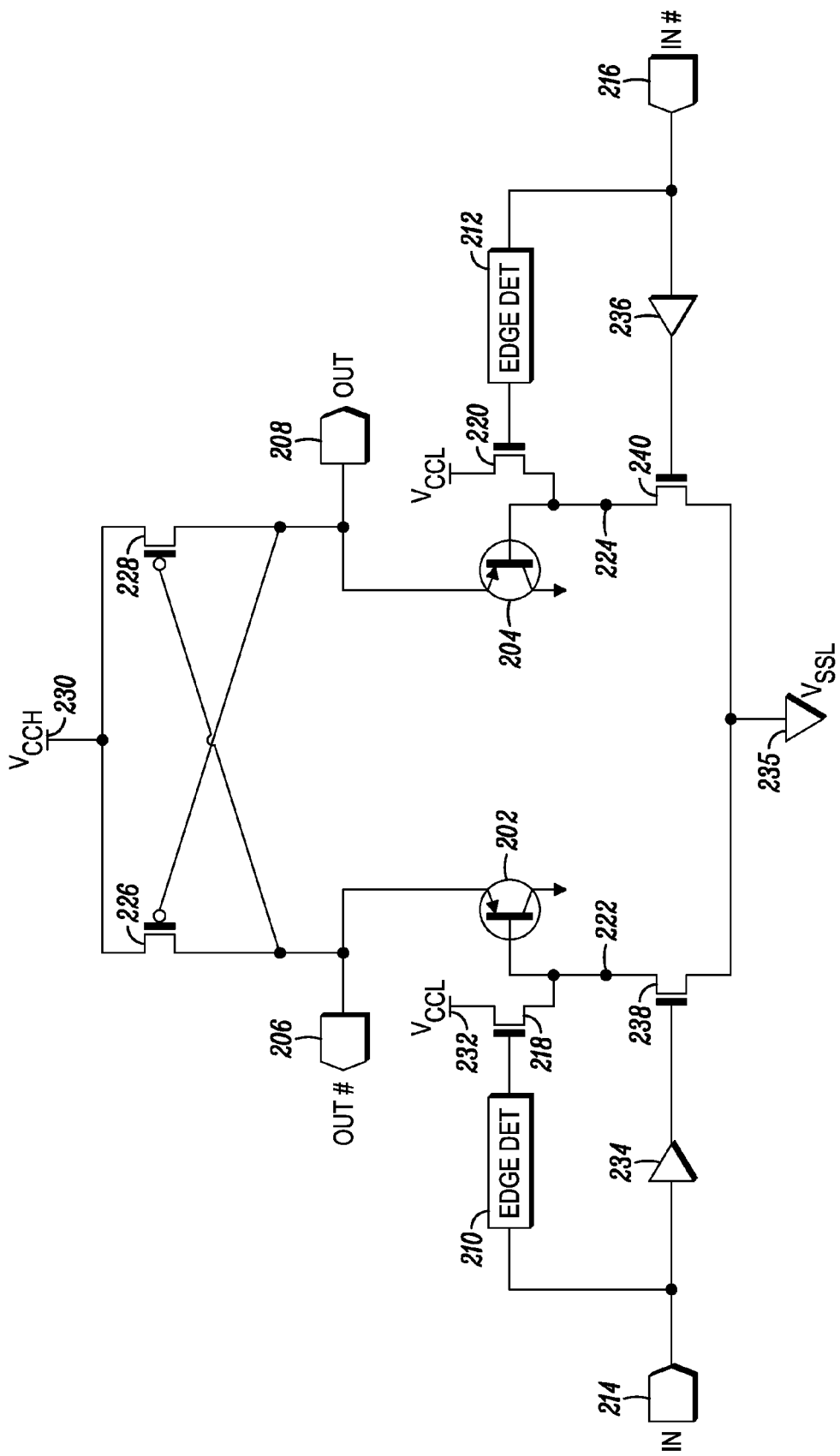
FIG. 2 illustrates a voltage level shifter circuit according to an embodiment.

FIG. 2 illustrates a voltage level shifter according to an embodiment. Diodes 202 and 204 are used to provide a voltage buffer, which is expected to be larger in value than the voltage buffer provided by transistors 110 and 112 in the prior art circuit of FIG. 1. Diodes 202 and 204 help prevent output ports 206 and 208 from reaching a voltage level that is lower than the diodes' forward voltage drop above $V_{SSL}$, e.g., 0.6V+ $V_{SSL}$ to 0.7V+$V_{SSL}$. The voltage $V_{SSL}$ is the LOW voltage in the first, or low-side, voltage domain.

Edge detection circuits 210 and 212 each provide a voltage pulse when a falling edge is detected at their respective input signal. For example, suppose the signal voltages at input ports 214 and 216 change, so that the voltage at input port 214 falls from $V_{CCL}$ to $V_{SSL}$ and the voltage at input port 216 rises from $V_{SSL}$ to $V_{CCL}$. Edge detection circuit 210 will provide a positive voltage pulse to the gate of pull-up nMOSFET 218 to turn it ON for the duration of the voltage pulse, whereas edge detection circuit 212 does not turn ON pull-up nMOSFET 220. With pull-down nMOSFET 238 OFF but with nMOSFET 218 turned ON momentarily, node 222 is pulled to $V_{CCL}$, whereas node 224 is pulled down to $V_{SSL}$ because pull-down nMOSFET 240 is ON. The diode forward voltage drop is added to these voltages by diodes 202 and 204, and cross coupled pMOSFETs 226 and 228 amplify this voltage difference, and latch the result, so that output port 206 is brought to $V_{CCH}$ and output port 208 is brought to $V_{SSL} + V_{EB}$, where $V_{EB}$ is the forward voltage drop provided by either of diodes 202 or 204. Here, $V_{SSL} + V_{EB} = V_{SSH}$, the LOW voltage in the second, or high-side, voltage domain.

Diodes 202 and 204 are not expected to be as leaky as diode-connected transistors 110 and 112, so that the embodiment of FIG. 2 need not require leakage current devices, such as for example transistors 130 and 132 of the prior art circuit in FIG. 1. Furthermore, because nMOSFET 218 is turned ON only momentarily for the duration of the pulse provided by edge detection circuit 210, there is no direct current path from high-side power rail 230 to low-side power rail 232, except for the time in which nMOSFET 218 is ON. (Rail 235 may be referred to as a low-side rail, serving as a ground or substrate rail for the low-side voltage domain.)

For some embodiments, the time duration of the voltage pulse provided by an edge detection circuit may be tuned to optimize performance, subject to a power-delay trade-off. The particular embodiment in FIG. 2 utilizes nMOSFETs for transistors 218 and 220 instead of pMOSFETs, so as to mitigate a possible parasitic diode structure that may result in power states where low-side power rail 232 is turned off and shorted to ground (235) or some other low voltage. However, other embodiments may employ pMOSFETs. Furthermore, diodes 202 and 204 in FIG. 2 are represented as the emitter-base junctions in bipolar junction transistors, so that the components labeled 202 and 204 in FIG. 2 may also be referred to as bipolar junction transistors. Other embodiments may utilize diodes that are not necessarily the emitter-base junctions of bipolar junction transistors.

Figure 3A:
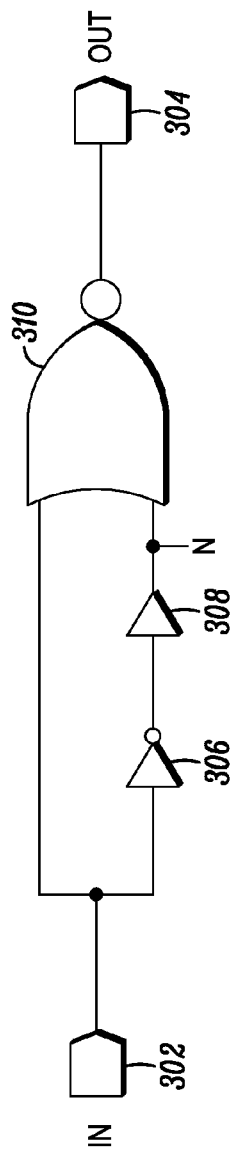
FIG. 3A illustrates an edge detection circuit used in the embodiment of FIG. 2.
Figure 3B:
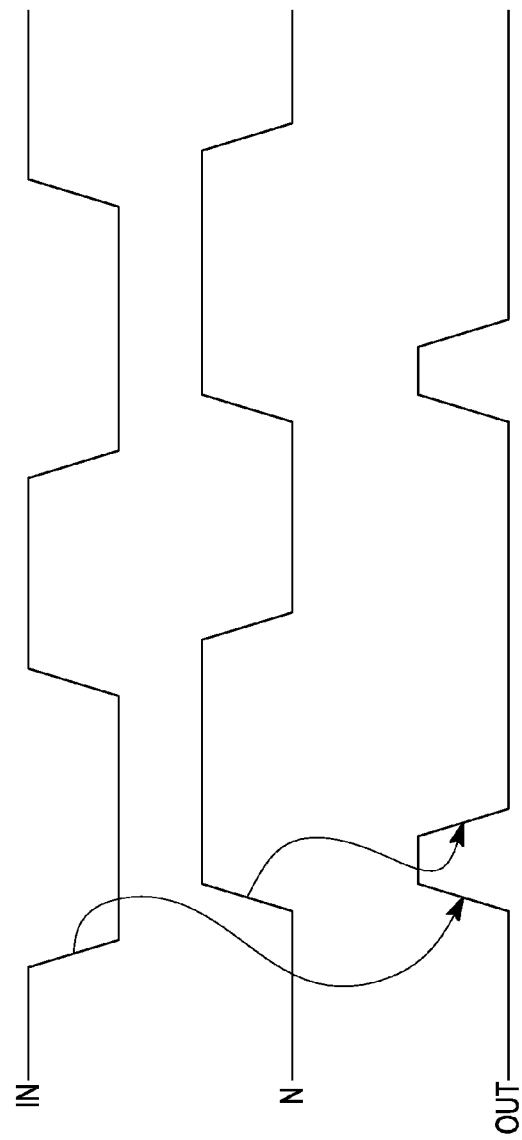
FIG. 3B illustrates voltage waveforms associated with the embodiment of FIG. 3A.

An embodiment for an edge detection circuit is illustrated at the logic level in FIG. 3A, where three voltage waveforms associated with the embodiment of FIG. 3A are shown in FIG. 3B. The waveform labeled "IN" in FIG. 3B (the top waveform) represents the voltage at input port 302, the waveform labeled "N" (the middle waveform) represents the voltage at the node in FIG. 3A labeled "N", and the waveform labeled "OUT" (the bottom waveform) represents the voltage at output port 304.

The logic circuit of FIG. 3A includes inverter 306, buffer 308, and NOR gate 310. Referring to the waveforms illustrated in FIG. 3B, note that there is a small delay in the edges of waveform "N" relative to the edges of waveform "IN", where a rising edge in waveform "N" lags a falling edge in waveform "IN". After a falling edge in waveform "IN", but before the corresponding rising edge in waveform "N", both inputs to logic NOR gate 310 are LOW (i.e., $V_{SSL}$ in the low-side voltage domain), so that the output signal, waveform "OUT", goes HIGH (i.e., $V_{CCL}$ in the low-side voltage domain). After the corresponding rising edge in waveform "N", waveform "OUT" goes LOW, as indicated in FIG. 3B. In this way, pulses with various time durations may be synthesized, depending upon the overall delay introduced by inverter 306 and buffer 308. (Inverter 306 may represent an odd number of logic inverters.) Buffers 234 and 236 in FIG. 2 introduce a delay so that the signal applied to the gates of pull-up transistors 218 and 220 may be timed to coincide with the signals applied to the gates of pull-down transistors 238 and 240.

It is expected that edge detection circuits 210 and 212 may be self-adapting to process variation. For example, a slower process may result in longer pulse widths at the output port of an edge detection circuit due to the inverter chain delay. Similar remarks apply to a fast process, resulting in shorter pulse widths for the output of an edge detection circuit.

Figure 4:
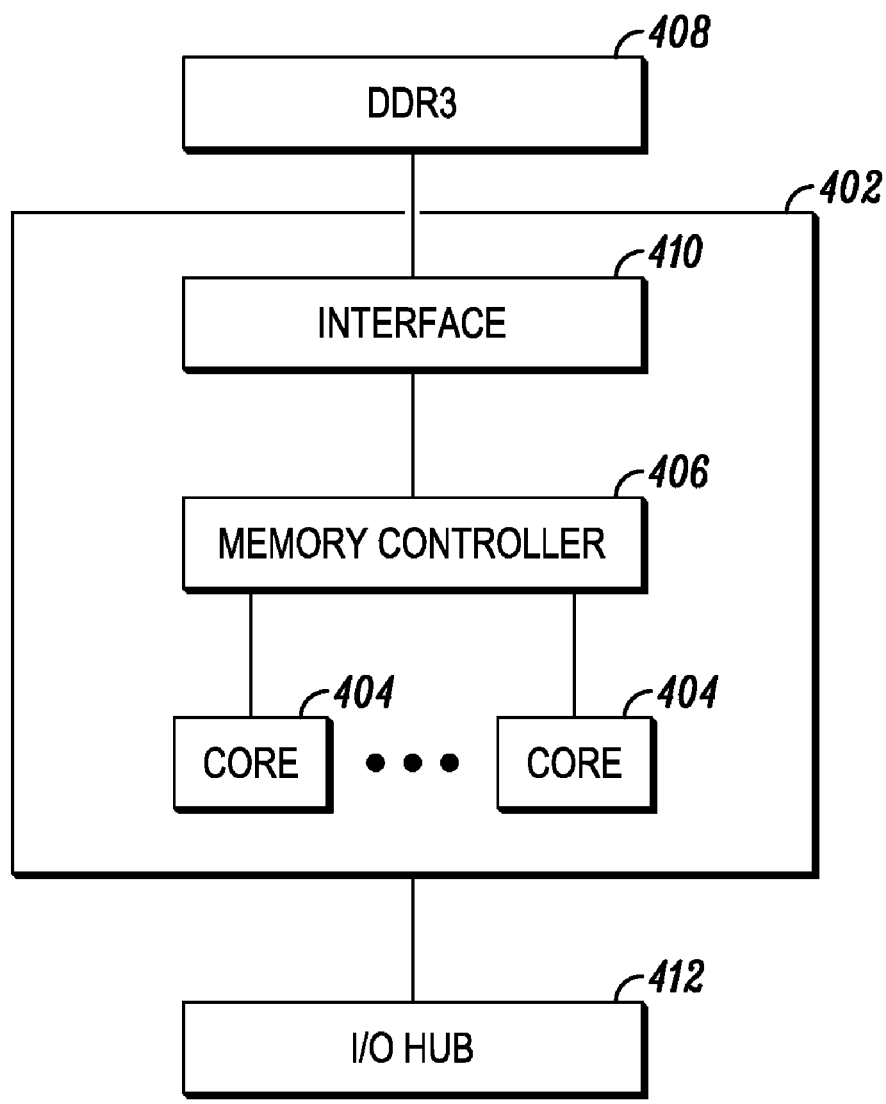
FIG. 4 illustrates a portion of a computer system employing an embodiment voltage level shifter circuit.

It is expected that embodiments may find applications in systems in which voltage levels in one part of the system (the "low-side" voltage domain) are to be shifted to another set of voltage levels used in another part of the system (the "high-side" voltage domain). As an example, some memory modules, such as DDR3 SRAM (Double Data Rate 3 Synchronous Dynamic Random Memory), may utilize a higher set of voltage levels than that used in microprocessor cores that access the DDR3 SRAM. FIG. 4 illustrates a portion of a computer system at a simplified level of abstraction, illustrating microprocessor 402 comprising a number of processor cores 404 in communication with integrated memory controller 406. In some applications, the voltage levels used in microprocessor cores 404 may be lower than that used in DDR3 memory 408, so that an embodiment voltage level shifter may find application in interface unit 410 so that cores 404 may communicate with DDR3 memory 408. Also shown in FIG. 4 is input output hub 412, which may be in communication with other system components (not shown).

Various modifications may be made to the described embodiments without departing from the scope of the invention as claimed below.

It is to be understood in these letters patent that the meaning of "A is connected to B", where A or B may be, for example, a node or device terminal, is that A and B are connected to each other so that the voltage potentials of A and B are substantially equal to each other. For example, A and B may be connected together by an interconnect (transmission line). In integrated circuit technology, the interconnect may be exceedingly short, comparable to the device dimension itself. For example, the gates of two transistors may be connected together by polysilicon, or copper interconnect, where the length of the polysilicon, or copper interconnect, is comparable to the gate lengths. As another example, A and B may be connected to each other by a switch, such as a transmission gate, so that their respective voltage potentials are substantially equal to each other when the switch is ON.

It is also to be understood in these letters patent that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element that in turn is connected to B.

It is also to be understood in these letters patent that a "current source" may mean either a current source or a current sink. Similar remarks apply to similar phrases, such as, "to source current".

It is also to be understood in these letters patent that various circuit components and blocks, such as current mirrors, amplifiers, etc., may include switches so as to be switched in or out of a larger circuit, and yet such circuit components and blocks may still be considered connected to the larger circuit.

What is claimed is:

1. A circuit comprising:
a first input port having a first input voltage;
a low-side rail and a low-side power rail;
a first pull-down transistor comprising a gate coupled to the first input port, a source connected to the low-side rail, and a drain;
a first pull-up transistor comprising a source connected to the drain of the first pull-down transistor, a drain connected to the low-side power rail, and a gate;
a first edge detection circuit for receiving said first input signal to provide a voltage pulse to the gate of the first pull-up transistor in response to a falling edge in the first input voltage; and
a first diode connected between an output port and the source of the first pull-up transistor.

2. The circuit as set forth in claim 1, the first diode comprising a transistor comprising a base connected to the source of the first pull-up transistor, a collector connected to the low-side rail, and an emitter.

3. The circuit as set forth in claim 2, further comprising:
the output port connected to the emitter of the first diode.

4. The circuit as set forth in claim 1, further comprising:
a high-side transistor comprising a gate, a drain connected to the first diode, and a source; and
a high-side power rail connected to the source of the high-side transistor.

5. The circuit as set forth in claim 1, further comprising:
a second input port having a second input voltage;
a second pull-down transistor comprising a gate coupled to the second input port, a source connected to the low-side rail, and a drain;
a second pull-up transistor comprising a source connected to the drain of the second pull-down transistor, a drain connected to the low-side power rail, and a gate;
a second edge detection circuit to provide a voltage pulse to the gate of the second pull-up transistor in response to a falling edge in the second input voltage; and
a second diode connected to the source of the second pull-up transistor.

6. The circuit as set forth in claim 5,
the first diode comprising a transistor comprising a base connected to the source of the first pull-up transistor, a collector connected to the low-side rail, and an emitter; and
the second diode comprising a transistor comprising a base connected to the source of the second pull-up transistor, a collector connected to the low-side rail, and an emitter.

7. The circuit as set forth in claim 6, further comprising:
a first output port connected to the emitter of the first diode; and
a second output port connected to the emitter of the second diode.

8. The circuit as set forth in claim 5, further comprising:
a first high-side transistor comprising a gate connected to the second diode, a drain connected to the first diode, and a source;
a second high-side transistor comprising a gate connected to the first diode, a drain connected to the second diode, and a source; and a high-side power rail connected to the source of the first high-side transistor and to the source of the second high-side transistor.

9. A computer system comprising:
a memory module;
a processor comprising a memory controller; and
an interface circuit coupled to the memory controller and the memory module, the interface circuit comprising:
a first input port having a first input voltage;
a low-side rail and a low-side power rail;
a first pull-down transistor comprising a gate coupled to the first input port, a source connected to the low-side rail, and a drain;
a first pull-up transistor comprising a source connected to the drain of the first pull-down transistor, a drain connected to the low-side power rail, and a gate;
a first edge detection circuit for receiving said first input signal to provide a voltage pulse to the gate of the first pull-up transistor in response to a falling edge in the first input voltage; and
a first diode connected between a first output port and the source of the first pull-up transistor.

10. The computer system as set forth in claim 9, the interface circuit further comprising:
a second input port having a second input voltage;
a second pull-down transistor comprising a gate coupled to the second input port, a source connected to the low-side rail, and a drain;
a second pull-up transistor comprising a source connected to the drain of the second pull-down transistor, a drain connected to the low-side power rail, and a gate;
a second edge detection circuit to provide a voltage pulse to the gate of the second pull-up transistor in response to a falling edge in the second input voltage; and
a second diode connected to the source of the second pull-up transistor.

11. The computer system as set forth in claim 10, the interface circuit further comprising:

a first high-side transistor comprising a gate connected to the second diode, a drain connected to the first diode, and a source;
a second high-side transistor comprising a gate connected to the first diode, a drain connected to the second diode, and a source; and
a high-side power rail connected to the source of the first high-side transistor and to the source of the second high-side transistor.

12. The computer system as set forth in claim 11,
the first diode comprising a transistor comprising a base connected to the source of the first pull-up transistor, a collector connected to the low-side rail, and an emitter; and
the second diode comprising a transistor comprising a base connected to the source of the second pull-up transistor, a collector connected to the low-side rail, and an emitter.

13. The computer system as set forth in claim 12, the interface circuit further comprising:
the first output port connected to the emitter of the first diode; and
a second output port connected to the emitter of the second diode.

14. The computer system as set forth in claim 9,
the first diode comprising a transistor comprising a base connected to the source of the first pull-up transistor, a collector connected to the low-side rail, and an emitter; and
the second diode comprising a transistor comprising a base connected to the source of the second pull-up transistor, a collector connected to the low-side rail, and an emitter.

15. The computer system as set forth in claim 9, the interface circuit further comprising:
a first output port connected to the emitter of the first diode; and
the second output port connected to the emitter of the second diode.

* * * * *